United States Patent
Smart et al.

(10) Patent No.: US 7,033,961 B1
(45) Date of Patent: Apr. 25, 2006

(54) EPITAXY/SUBSTRATE RELEASE LAYER

(75) Inventors: Joseph Smart, Morrisville, NC (US);
Brook Hosse, Huntersville, NC (US);
Shawn Gibb, Charlotte, NC (US);
David Grider, Huntersville, NC (US);
Jeffrey B. Shealy, Huntersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/620,205

(22) Filed: Jul. 15, 2003

(51) Int. Cl.
*H01L 21/26* (2006.01)

(52) U.S. Cl. .................. 438/796; 438/46; 438/795

(58) Field of Classification Search .......... 438/22, 438/46, 47, 308, 795–799; 117/3
See application file for complete search history.

(56) References Cited

U.S. PATENT DOCUMENTS

| | | | | |
|---|---|---|---|---|
| 5,608,353 A | 3/1997 | Pratt | ............ | 330/295 |
| 5,629,648 A | 5/1997 | Pratt | ............ | 330/289 |
| 6,384,433 B1 | 5/2002 | Barratt et al. | ............ | 257/197 |
| 6,387,733 B1 | 5/2002 | Holyoak et al. | ............ | 438/123 |
| 6,448,793 B1 | 9/2002 | Barratt et al. | ............ | 324/693 |
| 6,475,916 B1 * | 11/2002 | Lee et al. | ............ | 438/706 |
| 6,560,452 B1 | 5/2003 | Shealy | ............ | 455/333 |
| 6,589,877 B1 * | 7/2003 | Thakur | ............ | 438/703 |
| 6,608,367 B1 | 8/2003 | Gibson et al. | ............ | 257/666 |
| 6,621,140 B1 | 9/2003 | Gibson et al. | ............ | 257/531 |
| 6,627,552 B1 * | 9/2003 | Nishio et al. | ............ | 438/694 |
| 6,633,073 B1 | 10/2003 | Rezvani et al. | ............ | 257/504 |
| 6,656,271 B1 * | 12/2003 | Yonehara et al. | ............ | 117/94 |
| 6,657,592 B1 | 12/2003 | Dening et al. | ....... | 343/700 MS |
| 6,660,606 B1 * | 12/2003 | Miyabayashi et al. | ...... | 438/308 |
| 6,748,204 B1 | 6/2004 | Razavi et al. | ............ | 455/296 |
| 6,750,158 B1 * | 6/2004 | Ogawa et al. | ............ | 438/795 |
| 6,750,482 B1 | 6/2004 | Seaford et al. | ............ | 257/191 |
| 2003/0160307 A1 | 8/2003 | Gibson et al. | ............ | 257/666 |
| 2003/0209730 A1 | 11/2003 | Gibson et al. | ............ | 257/201 |

* cited by examiner

*Primary Examiner*—Ori Nadav
(74) *Attorney, Agent, or Firm*—Withrow & Terranova, PLLC

(57) ABSTRACT

The present invention relates to an epitaxial structure having one or more structural epitaxial layers, including a gallium nitride (GaN) layer, which is deposited on a substrate, and a method of growing the epitaxial structure, wherein the structural epitaxial layers can be separated from the substrate. In general, a sacrificial epitaxial layer is deposited on the substrate between the substrate and the structural epitaxial layers, and the structural epitaxial layers are deposited on the sacrificial layer. After growth, the structural epitaxial layers are separated from the substrate by oxidizing the sacrificial layer. The structural epitaxial layers include a nucleation layer deposited on the sacrificial layer and a gallium nitride layer deposited on the nucleation layer. Optionally, the oxidation of the sacrificial layer may also oxidize the nucleation layer.

25 Claims, 4 Drawing Sheets

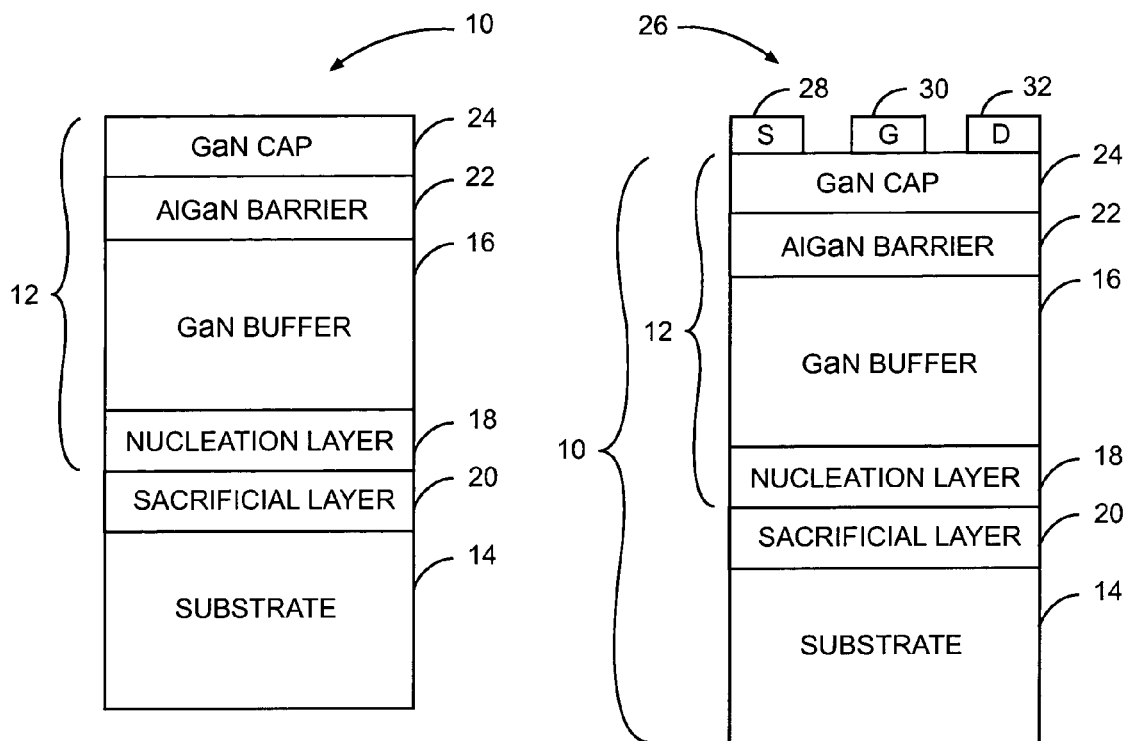
FIG. 3A
FIG. 3B
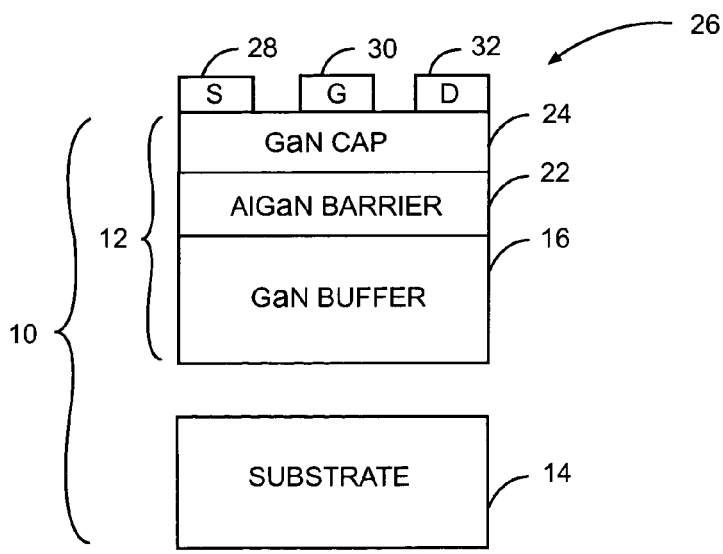
FIG. 3C

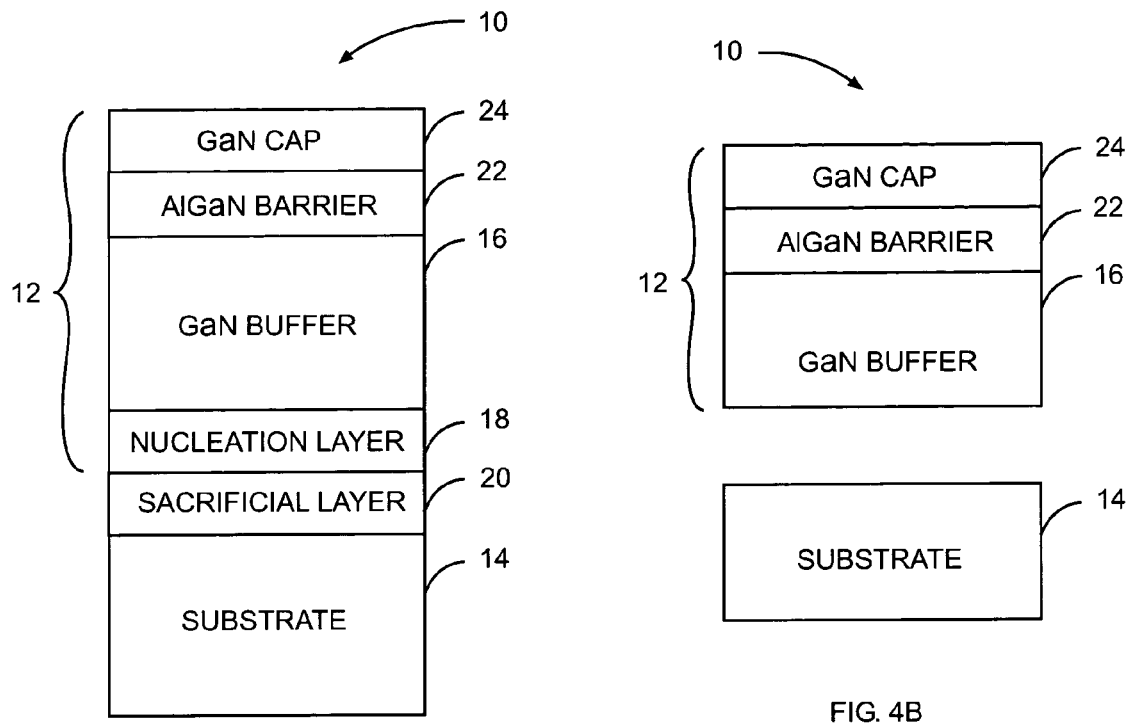
FIG. 4A
FIG. 4B
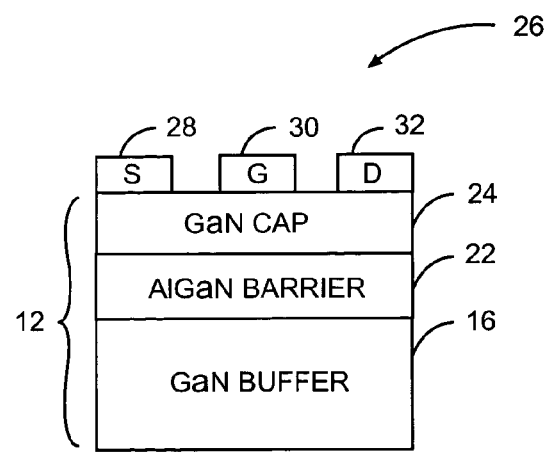
FIG. 4C

EPITAXY/SUBSTRATE RELEASE LAYER

FIELD OF THE INVENTION

The present invention relates to epitaxial growth on a substrate, and more particularly relates to releasing epitaxial layers from the substrate after growth.

BACKGROUND OF THE INVENTION

In general, epitaxial growth can be described as the growth or deposition of one or more thin crystalline layers (epitaxial layers) of various semiconductor materials on a crystalline substrate to form an epitaxial structure. Two types of epitaxial growths are homoepitaxial growth and heteroepitaxial growth. Homoepitaxial growth is when the substrate and epitaxial layers deposited on the substrate are made of the same material. Heteroepitaxial growth is when the substrate and the epitaxial layers deposited on the substrate are made of different materials. For heteroepitaxial growth, the atomic structures of the substrate and a first epitaxial layer must be similar in order to avoid major defects in the crystalline structure of the epitaxial layers due to mismatches between the lattice structures of the substrate and the first epitaxial layer. To overcome this limitation, a thin nucleation layer may be deposited on the substrate before depositing the first epitaxial layer.

The epitaxial structure may include any number of epitaxial layers. A single epitaxial layer of a desired material may be deposited on the substrate, where the epitaxial layer can be used as a seed to grow more of the desired material. For example, a single layer of gallium nitride (GaN) may be deposited on the substrate and later used as a seed to grow additional GaN epitaxial layers. On the other hand, multiple epitaxial layers may be deposited on the substrate in order to produce an epitaxial structure suitable for use in fabrication of an opto-electronic or electronic device, such as a high electron mobility transistor (HEMT) or a metal-insulator-semiconductor field effect transistor (MISFET).

For GaN epitaxial structures, one common material used as the substrate is sapphire. Sapphire is relatively inexpensive; however, it has properties such as poor thermal conduction, that are undesirable for many devices. Therefore, it may be desirable to separate the epitaxial layers from the sapphire or other substrates. Thus, there remains a need for a GaN epitaxial structure and a method of growing a GaN epitaxial structure, wherein the epitaxial layers can be separated from the substrate after growth.

SUMMARY OF THE INVENTION

The present invention relates to an epitaxial structure having one or more structural epitaxial layers, including a gallium nitride (GaN) layer, which are deposited on a substrate, and a method of growing the epitaxial structure, wherein the structural epitaxial layers can be separated from the substrate. In general, a sacrificial epitaxial layer is deposited on the substrate, and the structural epitaxial layers are deposited on the sacrificial layer. After growth, the structural epitaxial layers are separated from the substrate by oxidizing the sacrificial layer. The structural epitaxial layers may include a nucleation layer deposited on the sacrificial layer and a gallium nitride layer deposited on the nucleation layer. The oxidation of the sacrificial layer may also oxidize the nucleation layer.

In one embodiment, the one or more structural epitaxial layers include the nucleation layer and the gallium nitride buffer layer. In this embodiment, once the sacrificial layer and possibly the nucleation layer are oxidized, the gallium nitride layer may be used to form a freestanding substrate that can be used for gallium nitride homoepitaxial growth.

A device may be fabricated using the epitaxial structure before the structural epitaxial layers are separated from the substrate. In one embodiment, the structural epitaxial layers include an aluminum gallium nitride barrier layer deposited on the gallium nitride layer and a cap layer deposited on the aluminum gallium nitride barrier layer. Source, gate, and drain contacts are electrically connected to the cap layer, thereby fabricating a high electron mobility transistor. After fabrication, the sacrificial layer and optionally the nucleation layer are oxidized, thereby separating the electronic device from the substrate. In a similar fashion, various types of electronic and opto-electronic devices may be fabricated.

An electronic device may also be fabricated using the structural epitaxial layers after the structural epitaxial layers are separated from the substrate. In one embodiment, the structural epitaxial layers include a barrier layer deposited on the gallium nitride layer and a cap layer deposited on the barrier layer. After growth, the sacrificial layer and optionally the nucleation layer are oxidized, thereby separating the structural epitaxial layers from the substrate. Once the structural epitaxial layers are separated from the substrate, source, gate, and drain contacts may be electrically connected to the cap layer, thereby forming a high electron mobility transistor. In a similar fashion, various types of electronic and opto-electronic devices may be fabricated.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 3A illustrates a GaN structure according to one embodiment of the present invention;

FIG. 3B illustrates a high electron mobility transistor (HEMT) fabricated on the GaN structure of FIG. 3A according to one embodiment of the present invention;

FIG. 3C illustrates the HEMT of FIG. 3B after separation from a substrate according to one embodiment of the present invention;

FIG. 4A illustrates a GaN structure according to one embodiment of the present invention;

FIG. 4B illustrates the GaN structure of FIG. 4A after separation from a substrate according to one embodiment of the present invention;

FIG. 4C illustrates a HEMT fabricated on the GaN structure of FIG. 4B according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
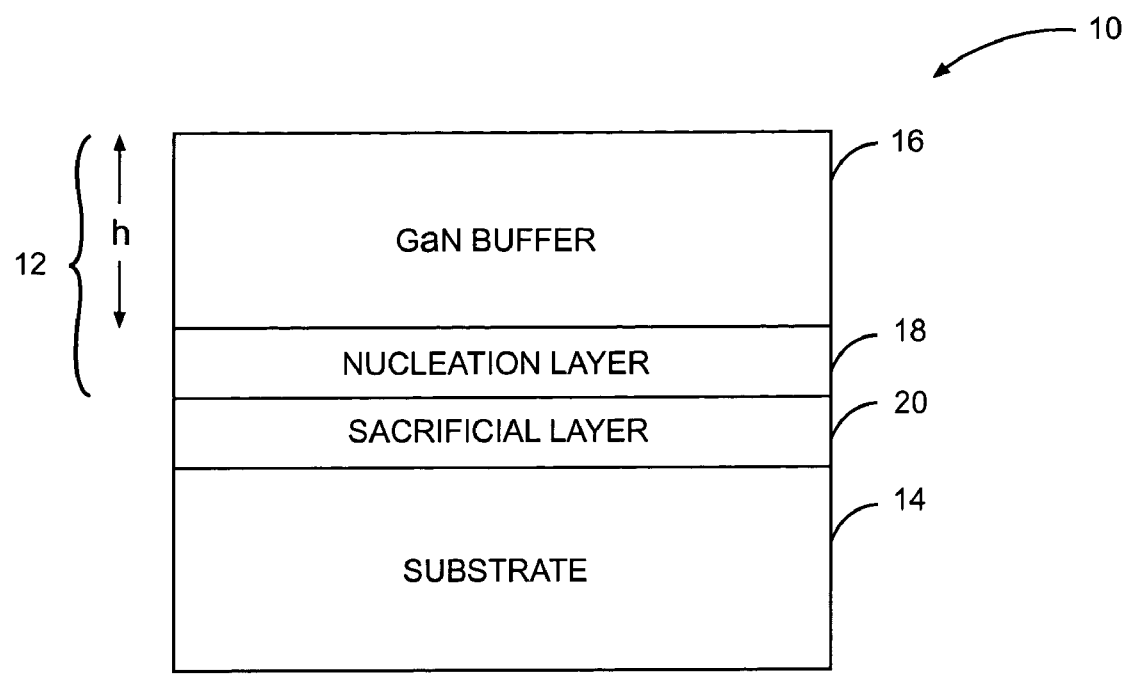
FIG. 1 illustrates a GaN structure according to one embodiment of the present invention.

The present invention is preferably incorporated in a gallium nitride (GaN) structure 10 as illustrated in FIG. 1. In general, the present invention allows the separation of structural epitaxial layers 12 from a substrate 14. In this embodiment, the structural epitaxial layers 12 include a GaN buffer 16 and a nucleation layer 18, which are separated from the substrate 14 by oxidizing a sacrificial layer 20 and optionally the nucleation layer 18.

A height h of the GaN buffer 16 is preferably at least fifty (50) micrometers (μm). However, the height h can be any height depending on requirements of the particular design. The substrate 14 can be any semiconductor material, including but not limited to sapphire, silicon carbide (SiC), silicon, gallium arsenide (GaAs), gallium nitride (GaN), aluminum nitride (AlN), and zinc oxide (ZnO). The sacrificial layer 20 is aluminum rich; and, in the preferred embodiment, both the sacrificial layer 20 and the nucleation layer 18 are aluminum rich epitaxial layers and may be essentially the same material. By being aluminum rich, the sacrificial layer 20 and preferably the nucleation layer 18 have a high aluminum mole fraction. In one embodiment, the aluminum mole fraction of the sacrificial layer 20 and possibly the nucleation layer 18 is greater than or equal to 0.3 (30%). Further, the sacrificial layer 20 and the nucleation layer 18 take the form of $Al_xGa_{1-x}N$, where x is between 0 and 1. As illustrated, the sacrificial layer 20 and the nucleation layer 18 are separate layers; however, these layers may be combined to form a single sacrificial nucleation layer (not shown), which functions as both the sacrificial layer 20 and the nucleation layer 18.

The GaN structure 10 may be grown by various techniques, including but not limited to Organic Metallic Vapor-Phase Epitaxy (OMVPE), Molecular Beam Epitaxy (MBE), Hydride Vapor-Phase Epitaxy (HVPE), and Physical Vapor Deposition (PVD). When growing the GaN structure 10, the sacrificial layer 20 is deposited on the substrate 14, and then the optional nucleation layer 18 is deposited on the sacrificial layer 20. The nucleation layer 18 and the sacrificial layer 20 operate to address the lattice mismatch between the GaN buffer 16 and the substrate 14. Lattice mismatch is created when spacing between atoms of one layer does not match the spacing between atoms of an adjacent layer. This results in the formation of dislocations in the epitaxial layer as well as macroscopic cracking of the epitaxial material. The nucleation layer 18 and the sacrificial layer 20 operate to accommodate the lattice mismatch by creating an interface between the crystalline structure of the substrate 14 and the crystalline structure of the GaN buffer 16.

Once the sacrificial layer 20 and the nucleation layer 18 are deposited on the substrate 14, the GaN buffer 16 is deposited on the nucleation layer 18. Since the nucleation layer 18 and the sacrificial layer 20 correct the lattice mismatch between the GaN buffer 16 and the substrate 14, the GaN buffer 16 is a high-quality GaN material.

Figure 2:
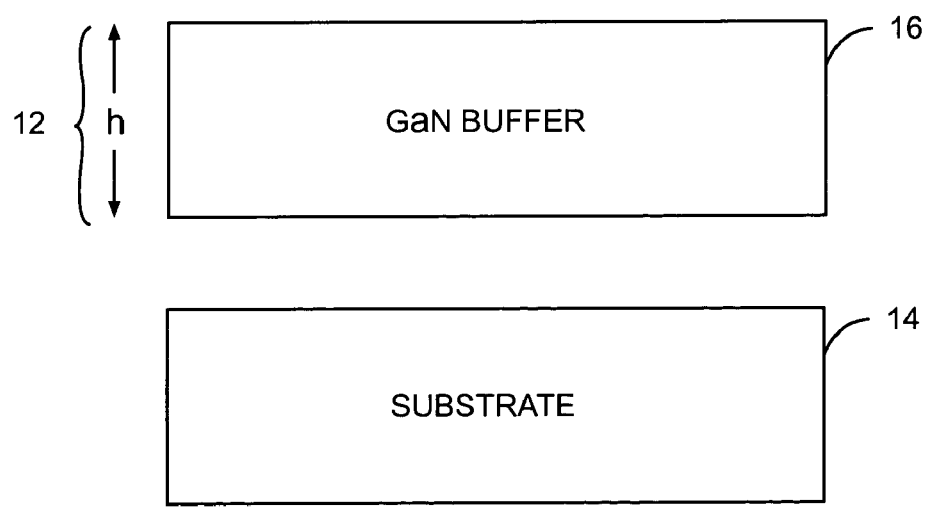
FIG. 2 illustrates the GaN structure of FIG. 1 after separation from a substrate according to one embodiment of the present invention.

Once the GaN buffer 16 has been deposited on the nucleation layer 18 or on the sacrificial layer 20 if the nucleation layer 18 is not present, the sacrificial layer 20 is dissolved by oxidization. The sacrificial layer 20 may be oxidized in a steam oven or by means including but not limited to subjecting the sacrificial layer 20 to hydrogen peroxide etch. Since the sacrificial layer 20 and the nucleation layer 18 may be essentially the same material, both may be dissolved during oxidation. The oxidation of the sacrificial layer 20, and optionally the nucleation layer 18, separates the GaN buffer 16 from the substrate 14, as illustrated in FIG. 2. Once the GaN buffer 16 is separated from the substrate 14, the GaN buffer 16 may be used as a seed to grow high-quality GaN material or as a substrate for a semiconductor device.

FIGS. 3A–3C illustrate another embodiment of the present invention. As illustrated in FIG. 3A, the GaN structure 10 is similar to the embodiment of the GaN structure 10 illustrated in FIG. 1. In addition to the nucleation layer 18 and GaN buffer 16, the structural epitaxial layers 12 include an aluminum gallium nitride (AlGaN) barrier layer 22 and a GaN cap layer 24. Once the GaN structure 10 including the AlGaN barrier layer 22 and the GaN cap layer 24 has been grown, a high electron mobility transistor (HEMT) 26 is fabricated by separately forming a source ohmic contact (S) 28, a Schottky gate contact (G) 30, and a drain ohmic contact (D) 32 on the GaN cap layer 24, as illustrated in FIG. 3B. The contacts 28, 30, and 32 are metallic and may be made of materials such as but not limited to titanium, tantalum, aluminum, gold, and nickel. The operational details of the HEMT 26 of this embodiment are essentially the same as the operational details of known GaN HEMT devices and are not necessary to describe the present invention.

The structural epitaxial layers 12, which along with the contacts 28, 30, and 32 form the HEMT 26, are separated from the substrate 14 by oxidation of the sacrificial layer 20, and optionally the nucleation layer 18. FIG. 3C illustrates the HEMT 26 after separation from the substrate 14. After being released from the substrate 14, the HEMT 26 may be placed on a heat sink, or a package to form a semiconductor device or part of an integrated circuit. Further, once released from the substrate 14, the GaN buffer 16, which is preferably at least 50 μm thick, can support the HEMT 26 and eliminate post-process substrate thinning. Therefore, the present invention provides a method for growing and fabricating an electronic device on an inexpensive substrate such as sapphire; and once fabricated, the electronic device is separated from the substrate, thereby eliminating any undesirable electronic and thermal properties of the substrate.

FIGS. 4A–4C illustrate yet another embodiment in which the substrate 14 is released prior to fabricating the HEMT 26. FIG. 4A illustrates the GaN structure 10 including the GaN buffer 16, the substrate 14, the sacrificial layer 20, the nucleation layer 18, the AlGaN barrier 22, and the GaN cap 24. FIG. 4B illustrates the GaN structure 10 after the separation of the structural epitaxial layers 12 from the substrate 14 by oxidation of the sacrificial layer 20, and optionally the nucleation layer 18. After separation, the HEMT 26 is fabricated by separately forming the source ohmic contact 28, the Schottky gate contact 30, and the drain ohmic contact 32 on the GaN cap 24, as illustrated in FIG. 4C.

Although FIGS. 3A–3C and 4A–4C illustrate the growth and fabrication of the HEMT 26, these are merely exemplary embodiments. The sacrificial layer 20 may be implemented in the growth and fabrication of various semiconductor devices in order to separate a substrate from epitaxial layers after growth, and either before or after device fabrication.

Figure 5:
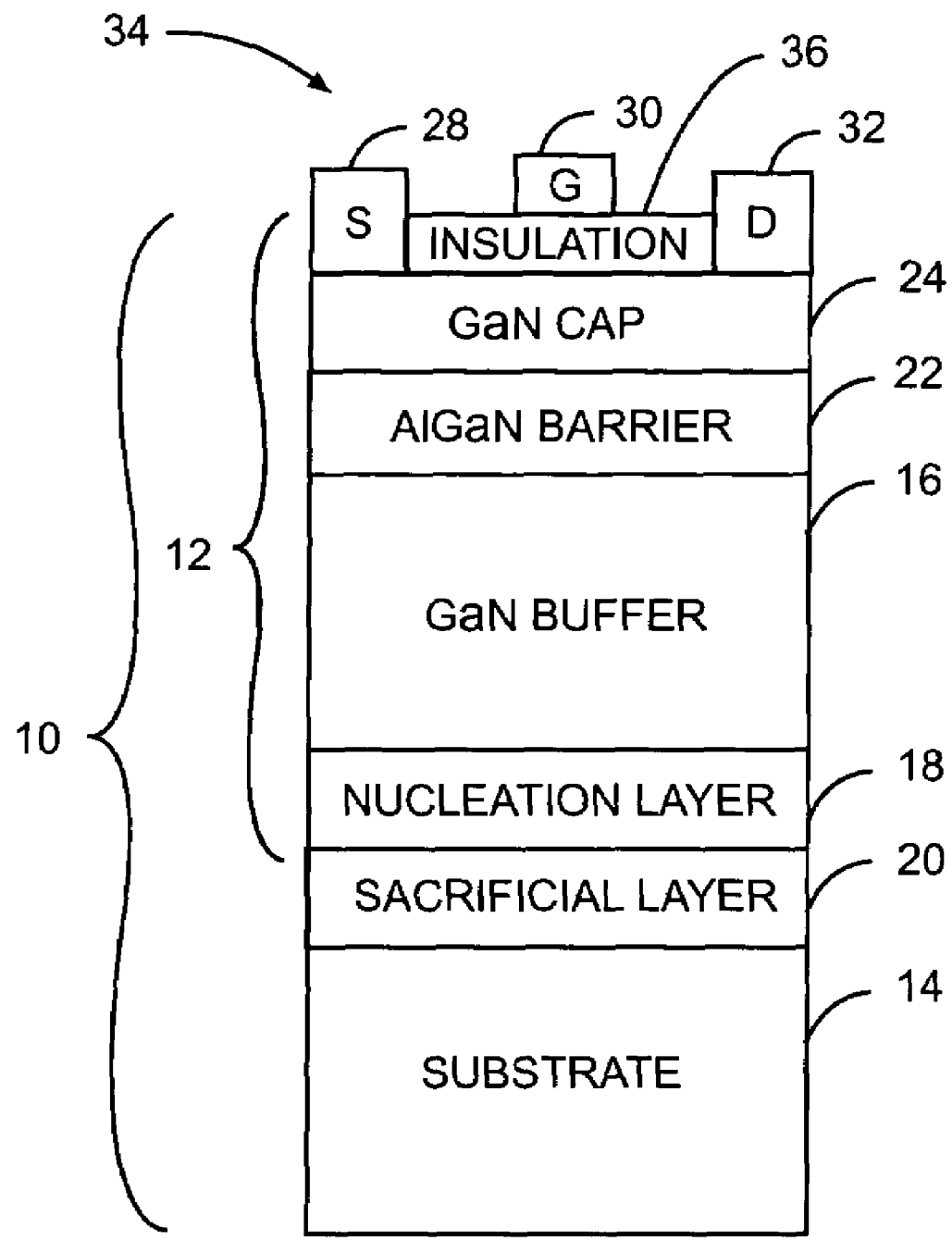
FIG. 5 illustrates a MISFET according to one embodiment of the present invention.

For example, as illustrated in FIG. 5, a metal-insulator-semiconductor field effect transistor (MISFET) 34 may be fabricated similarly to the embodiments in FIGS. 3A–3C or FIGS. 4A–4C by placing an insulating layer 36 between the gate contact 30 and the GaN cap layer 24. The insulation layer 36 can be any dielectric material. The source contact 28 and drain contact 32 are formed on the GaN cap layer 24, and the gate contact 30 is form on the insulation layer 36. As described previously, the structural epitaxial layers 12 may be separated from the substrate 14 by oxidizing the sacrificial layer 20, and optionally the nucleation layer 18, either before or after the source contact 28, gate contact 30, and drain contact 32 are separately formed.

Those skilled in the art will recognize improvements and modifications to the preferred embodiments of the present invention. All such improvements and modifications are considered within the scope of the concepts disclosed herein and the claims that follow.

What is claimed is:

1. A method of growing a gallium nitride (GaN) epitaxial structure and fabricating an electronic device comprising:
   a) depositing a sacrificial epitaxial layer on a substrate, wherein the sacrificial epitaxial layer is essentially aluminum gallium nitride;
   b) depositing one or more structural epitaxial layers including a GaN buffer layer on the sacrificial epitaxial layer; and
   c) oxidizing the sacrificial epitaxial layer to separate the substrate from the one or more structural epitaxial layers, wherein oxidizing the sacrificial epitaxial layer alters the chemical composition of the sacrificial epitaxial layer such that an ability of the sacrificial layer to adhere the substrate to the one or more epitaxial layers is substantially reduced.

2. The method of claim 1 further comprising fabricating an electronic device using the epitaxial layers.

3. The method of claim 1 wherein the one or more structural epitaxial layers further comprises a nucleation layer, further wherein the depositing the one or more structural epitaxial layers step comprises depositing the nucleation layer on the sacrificial epitaxial layer.

4. The method of claim 3 wherein the oxidizing step further oxidizes the nucleation layer.

5. The method of claim 3 wherein the depositing the one or more structural epitaxial layers step further comprises depositing the GaN buffer layer on the nucleation layer.

6. The method of claim 5 wherein the one or more structural epitaxial layers further comprise a barrier layer and a cap layer, further wherein the depositing the one or more structural epitaxial layers step further comprises:
   a) depositing the barrier layer on the GaN buffer layer; and
   b) depositing the cap layer on the barrier layer.

7. The method of claim 6 further comprising:
   a) forming an ohmic source contact on the cap layer;
   b) forming an ohmic drain contact on the cap layer; and
   c) forming a gate contact on the cap layer between the source contact and the drain contact,
   wherein the source, gate, and drain contacts are separate contacts.

8. The method of claim 6 wherein the one or more structural epitaxial layers further comprises an insulation layer, further wherein the depositing the one or more structural epitaxial layers step further comprises depositing the insulation layer on the cap layer.

9. The method of claim 8 further comprising:
   a) forming a source contact on the cap layer;
   b) forming a drain contact on the cap layer; and
   c) forming a gate contact on the insulation layer between the source contact and the drain contact,
   wherein the source, gate, and drain contacts are separate contacts.

10. The method of claim 1 wherein the oxidizing step oxidizes the sacrificial epitaxial layer with steam.

11. The method of claim 1 wherein the oxidizing step oxidizes the sacrificial epitaxial layer with hydrogen peroxide.

12. A method of fabricating an electronic device comprising:
   a) depositing a sacrificial epitaxial layer on a substrate, wherein the sacrificial epitaxial layer is essentially aluminum gallium nitride;
   b) depositing one or more structural epitaxial layers including a gallium nitride (GaN) buffer layer on the sacrificial epitaxial layer;
   c) fabricating an electronic device on the structural epitaxial layers; and
   d) oxidizing the sacrificial epitaxial layer to separate the substrate from the electronic device, wherein oxidizing the sacrificial epitaxial layer alters the chemical composition of the sacrificial epitaxial layer such that an ability of the sacrificial layer to adhere the substrate to the one or more epitaxial layers is substantially reduced.

13. The method of claim 12 wherein the one or more structural epitaxial layers further comprises a nucleation layer, further wherein the depositing the one or more structural epitaxial layers step comprises depositing the nucleation layer on the sacrificial epitaxial layer.

14. The method of claim 13 wherein the oxidizing step further oxidizes the nucleation layer.

15. The method of claim 13 wherein the depositing the one or more structural epitaxial layers step further comprises depositing the GaN buffer layer on the nucleation layer.

16. The method of claim 15 wherein the one or more structural epitaxial layers further comprises a barrier layer and a cap layer, further wherein the depositing the one or more structural epitaxial layers step further comprises:
   i) depositing the barrier layer on the GaN buffer layer; and
   ii) depositing the cap layer on the barrier layer.

17. The method of claim 16 wherein the fabricating step comprises:
   i) forming an ohmic source contact on the cap layer;
   ii) forming an ohmic drain contact on the cap layer; and
   iii) forming a gate contact on the cap layer between the source contact and the drain contact,
   wherein the source, gate, and drain contacts are separate contacts.

18. The method of claim 16 wherein the one or more structural epitaxial layers further comprises an insulation layer, further wherein the depositing the one or more structural epitaxial layers step further comprises depositing the insulation layer on the cap layer.

19. The method of claim 18 wherein the fabricating step comprises:
   i) forming an ohmic source contact on the cap layer;
   ii) forming an ohmic drain contact on the cap layer; and
   iii) forming a gate contact on the insulation layer between the source contact and the drain contact,
   wherein the source, gate, and drain contacts are separate contacts.

20. The method of claim 12 wherein the oxidizing step oxidizes the sacrificial epitaxial layer with steam.

21. The method of claim 12 wherein the oxidizing step oxidizes the sacrificial epitaxial layer with hydrogen peroxide.

22. A method of growing a gallium nitride (GaN) epitaxial structure and fabricating an electronic device comprising:
   a) depositing a sacrificial epitaxial layer on a substrate, wherein the sacrificial epitaxial layer has a high aluminum mole fraction;
   b) depositing one or more structural epitaxial layers including a GaN buffer layer on the sacrificial epitaxial layer; and
   c) oxidizing the sacrificial epitaxial layer to separate the substrate from the one or more structural epitaxial layers, wherein oxidizing the sacrificial epitaxial layer alters the chemical composition of the sacrificial epitaxial layer such that an ability of the sacrificial layer to adhere the substrate to the one or more epitaxial layers is substantially reduced.

23. The method of claim 22 wherein the aluminum mole fraction is greater than or equal to 0.3.

24. A method of fabricating an electronic device comprising:
   a) depositing a sacrificial epitaxial layer on a substrate, wherein the sacrificial epitaxial layer has a high aluminum mole fraction;
   b) depositing one or more structural epitaxial layers including a gallium nitride (GaN) buffer layer on the sacrificial epitaxial layer;
   c) fabricating an electronic device on the structural epitaxial layers; and
   d) oxidizing the sacrificial epitaxial layer to separate the substrate from the electronic device, wherein oxidizing the sacrificial epitaxial layer alters the chemical composition of the sacrificial epitaxial layer such that an ability of the sacrificial layer to adhere the substrate to the one or more epitaxial layers is substantially reduced.

25. The method of claim 24 wherein the aluminum mole fraction is greater than or equal to 0.3.

* * * * *